(12) United States Patent
Sood

(10) Patent No.: US 7,774,735 B1
(45) Date of Patent: Aug. 10, 2010

(54) INTEGRATED CIRCUIT NETLIST MIGRATION

(75) Inventor: Ankush Sood, Haryana (IN)

(73) Assignee: Cadence Design Systems, Inc, San Jose, CA (US)

( * ) Notice: Subject to any disclaimer, the term of this patent is extended or adjusted under 35 U.S.C. 154(b) by 427 days.

(21) Appl. No.: 11/683,401

(22) Filed: Mar. 7, 2007

(51) Int. Cl.
*G06F 17/50* (2006.01)

(52) U.S. Cl. .............................. 716/18; 716/1; 716/11

(58) Field of Classification Search ............... 716/1, 716/11, 18
See application file for complete search history.

(56) References Cited

U.S. PATENT DOCUMENTS 6,067,650 A * 5/2000 Beausang et al. ........... 714/726
7,028,272 B2   4/2006 Mandal et al.

OTHER PUBLICATIONS

McGehee, J.; API vs. File Exchange, Apr. 4, 2006, pp. 1-5, Voom, Inc. Los Altos, CA.
TSMC Libraries, Advanced Technology Standard Cells Industry Standards I/OS, pp. 1-33, 2003.
TSMC, IP and Library Alliance, pp. 1-4, Apr. 2003.
Birnbaum, M; Essential Electronic Design Automation, 2004, pp. 136-137, Pearson Education, Inc. New Jersey.
Unknown, TSMC Library Content, 1 pg. Oct. 10, 2006.
Unknown, ASIC Deliverables Checklist Customer deliverables to Felxtronics Semiconductor, pp. 1-8, Flextronics Semiconductor, Inc. Jan. 31, 2007.

* cited by examiner

*Primary Examiner*—Thuan Do
(74) *Attorney, Agent, or Firm*—Alford Law Group, Inc.; William E. Alford

(57) ABSTRACT

A method for migrating a netlist from one set of library cells to a new set of library cells with minimal time and effort and without loss of information within an ASCI environment. This methodology ensures that during translation logic equivalence and scan configurations are maintained in the new technology libraries. Additionally, a complete migration of the constraints from the original netlist to the new netlist is also performed. Designer engineers no longer have to start from RTL and execute a complete resynthesis to translate an original design from one technology library to a new technology library.

21 Claims, 6 Drawing Sheets

INTEGRATED CIRCUIT NETLIST MIGRATION

FIELD

The embodiments of the invention relate generally to the design of integrated circuits. More specifically, the embodiments of the invention relate to migrating or porting a netlist description of an integrated circuit design from one set of technology libraries to another.

BACKGROUND

Application specific integrated circuits (ASICs) are widely used to implement sophisticated electronic circuits for mass production. An application specific integrated circuit is a semi-custom integrated circuit that uses a cell library of circuit or logical cells that are instantiated to form the overall function of the ASIC.

ASICs are developed in a number of different ways. One approach is to construct a prototype using discrete components wired together on a bread board or an etched printed circuit board. The prototype is tested and debugged to be sure the proper function of the ASIC. The prototype definition is then migrated into a monolithic integrated circuit, an ASIC design.

A cell is a group of one or more circuit elements such as transistors, capacitors, and other basic circuit elements connected together to perform a function. Cells are provided as part of an ASIC design technology library that defines which cells are implemented in a specific circuit design.

In a few years technology has moved very quickly from 180 nm to 65 nm or even below channel widths. The need to constantly build smaller and faster circuits means that designers and electronic companies need to move their existing designs to the latest technology as quickly and efficiently as possible to avoid losing the any opportunity to market their products and designs. Generally, transferring an old design to a new technology requires engineers to go through a long and tedious design process starting over with the RTL description of the design. A company that has several design teams participating at multiple stages of the design process will therefore have to expend a large amount of time and cost for their teams to go through the design process starting with the RTL description to produce a new netlist.

A netlist is a detailed interconnection listing logic gate cells, blocks, black-boxes or other elements in a particular technology from which mask layouts may be automatically produced for integrated circuit fabrication. The netlist may be in Verilog or VHDL format and is generated from synthesis tools, such as the RTL Compiler synthesis tool by Cadence Design Systems, Inc.

There are special processes involved prior to releasing a netlist to the back-end physical design flow. These time consuming and demanding steps include design-for-test (DFT) synthesis and scan-chain stitching, observation point insertion to improve DFT coverage, selection of good data path architecture to meet design timing requirements, and any engineering-change-order (ECO) level changes made to the netlists that are not reflected in the register transfer level (RTL) hardware description.

It may be desirable to migrate an existing ASIC design from one set of library cells to a new set of library cells without any substantial loss or substantial change to the function of the original integrated circuit design. This may be to obtain a second source of wafer fabrication ("silicon foundry") for the ASIC design that has additional capacity. Another reason to migrate the ASIC design may be to improve performance and/or reduce die size and costs.

One problem designers face today in migrating one circuit design to a new technology is the time and effort generally required to manually update the library-cells associated with instances in a netlist. Such manual effort needed for developing and updating the cells is time consuming and prone to errors.

Another common problem faced today is related to yield improvements. Based on the results of a product testing, a company may find that a given set of library cells in their technology libraries give lower yields in post production. In such cases, the company would ideally desire to have the ability to efficiently make small changes to their current designs by removing the lower yielding cells or substituting the lower yielding cells with higher yielding ones without having to repeat the design flow for designing an entire ASIC design.

The typical approach to migrating an ASIC design from one technology library to another is to start from the register transfer level (RTL) hardware description input and repeat the entire ASIC design flow there-from, including performing a complete synthesis once again of the entire ASIC design. This approach of migrating an ASIC design is a long and strenuous process requiring multiple levels of design resources, including ASIC design engineers, that can be quite costly.

Although other migration approaches may begin from the netlist level may exist, they are often not employed because of certain limitations. For example, Solutions starting from netlist, for instance, have the basic limitation of being incapable of handling scan-stitched netlists. In effect, the scan-configuration is completely broken and requires full scan-resynthesis. Additionally, clock-gating integrated cells are often not handled appropriately. Consequently, the constraint migration to the new netlist becomes incomplete. These limitations, therefore, render these existing solutions practically useless.

It is desirable to overcome the foregoing deficiencies of prior netlist migration and provide fast turnaround times with minimal effort on part of the design engineers.

SUMMARY OF THE INVENTION

The embodiments of the invention are summarized by the claims that follow below.

BRIEF DESCRIPTION OF THE DRAWINGS

Various features of the embodiments of the invention which are believed to be novel are set forth with particularity in the appended claims. The embodiments of the invention may be understood by reference to the following detailed description, taken in connection with the accompanying drawings which are briefly described as follows:

DETAILED DESCRIPTION

Figure 1:
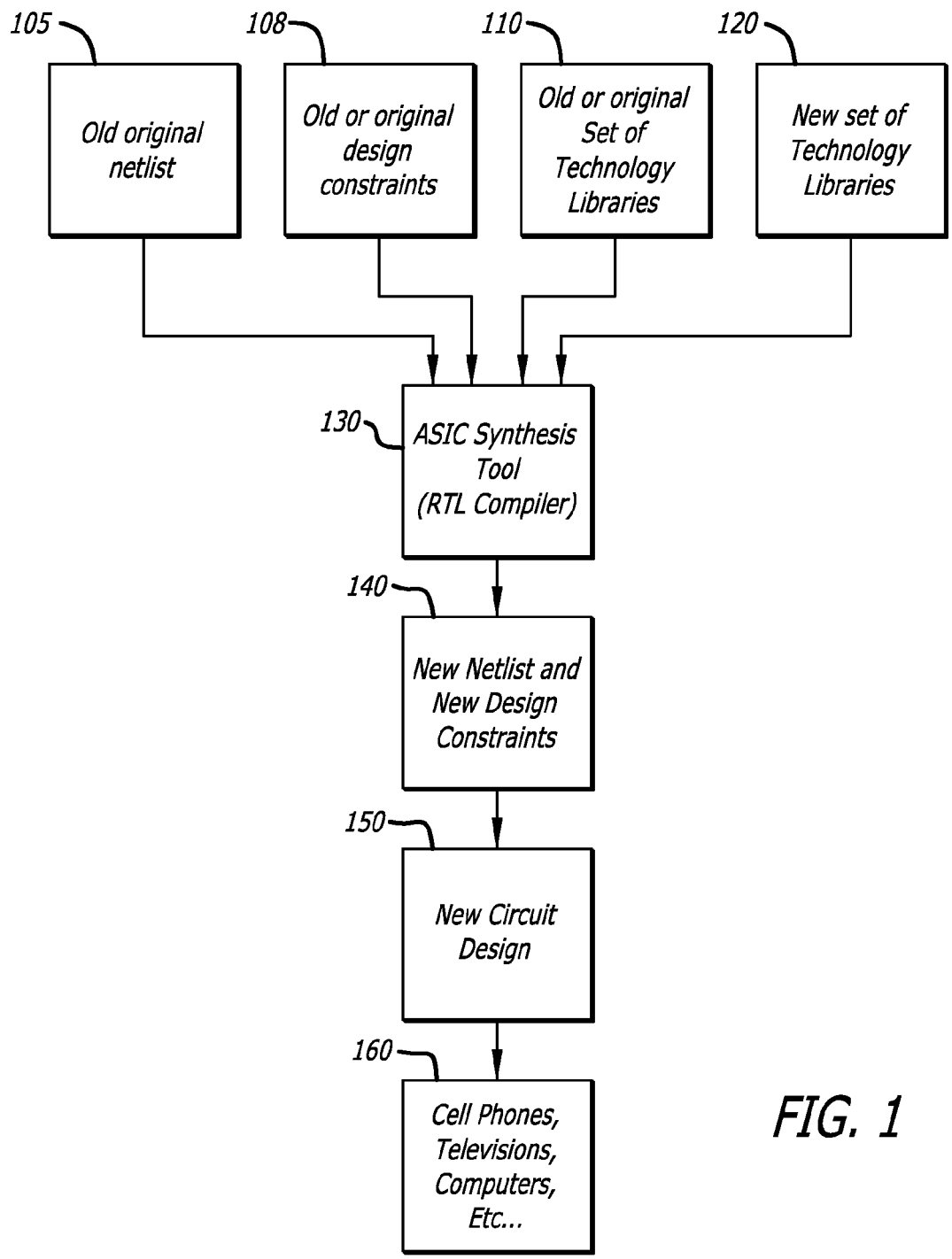
FIG. 1 is a block diagram illustrating the details of an example environment in which the embodiments of the invention can be implemented.

The following detailed description is of the best presently contemplated mode of carrying out the present method. This description is not to be taken in a limiting sense, but is made merely for the purpose of illustrating general principles of embodiments of the invention. The scope of the embodiments of the invention is best defined by the appended claims.

INTRODUCTION

The embodiments of the invention provide a method for migrating a netlist from one set of library cells to a new set of library cells without any modifications to the functionality of the original design module. The embodiments of the invention can function within any ASIC synthesis tool, such as the RTL Compiler (RC) synthesis tool by Cadence Design Systems, Inc.

A method for migrating a netlist mapped to a given set of library cells to a new set of library cells is disclosed. The described methodology, for instance, provides for a mechanism to migrate from one semiconductor manufacturing technology (e.g., 0.13 um (micron) minimum channel length) to a new semiconductor manufacturing technology (e.g., 0.09 um minimum channel length) in a very short time span with minimal user effort. The embodiments of the invention ensure that the three pre-requisites are met for any migration under substantially all circumstances. The three pre-requisites are (1) logic equivalence between the original netlist and the new netlist, (2) complete migration of the constraints to the new netlist mapped into the new set of library cells, and (3) the ability to maintain the same design-for-test (DFT) scan configuration from the original netlist to the new netlist.

The methodology described herein eliminates the need to start with a register transfer level (RTL) description of the integrated circuit design and re-synthesize the entire design from scratch. The embodiments of the invention avoid performing the entire scan-synthesis process, a process that requires a large amount of time and multiple resources. The embodiments of the invention provide a simple one-step, fully automatic mechanism for handling any type of DFT scan-configuration in a netlist with minimal user effort.

However, the methodology is limited in that it applies to the functional core of a gate level netlist description of the integrated circuit design and does not work on black-boxes that may be defined in the original netlist of the integrated circuit design.

In one embodiment of the invention, scan-stitched netlists are translated from one set of technology libraries to a new set of technology libraries. A scan-stitched netlist is a netlist that has been designed for testing (DFT) and includes scan cells and scan chains to test an integrated circuit using standard automated test pattern generation (ATPG) testing techniques etc. In another embodiment of the invention the entire set of integrated design constraints (e.g., SDC constraints) are migrated to the new netlist without having to manually migrate all the integrated circuit design constraints.

Manual translation is an extremely time consuming process, and in some cases, may not be easily feasible. The embodiments of the invention provide an automated approach to netlist translation to reduce time and costs.

In another embodiment of the invention, a method of migrating clock-gating integrated cells (CGICs) from one set of technology libraries to a new set of technology libraries is provided. CGICs typically do not have functional information described in a technology library. The embodiments of the invention automatically search the new technology library to find a structurally similar substitution in the new technology libraries for the CGICs. The automated methodology reduces the time and effort of design engineers normally required to manually migrate CGICs to a new process technology.

Netlist Migration

Figure 4:
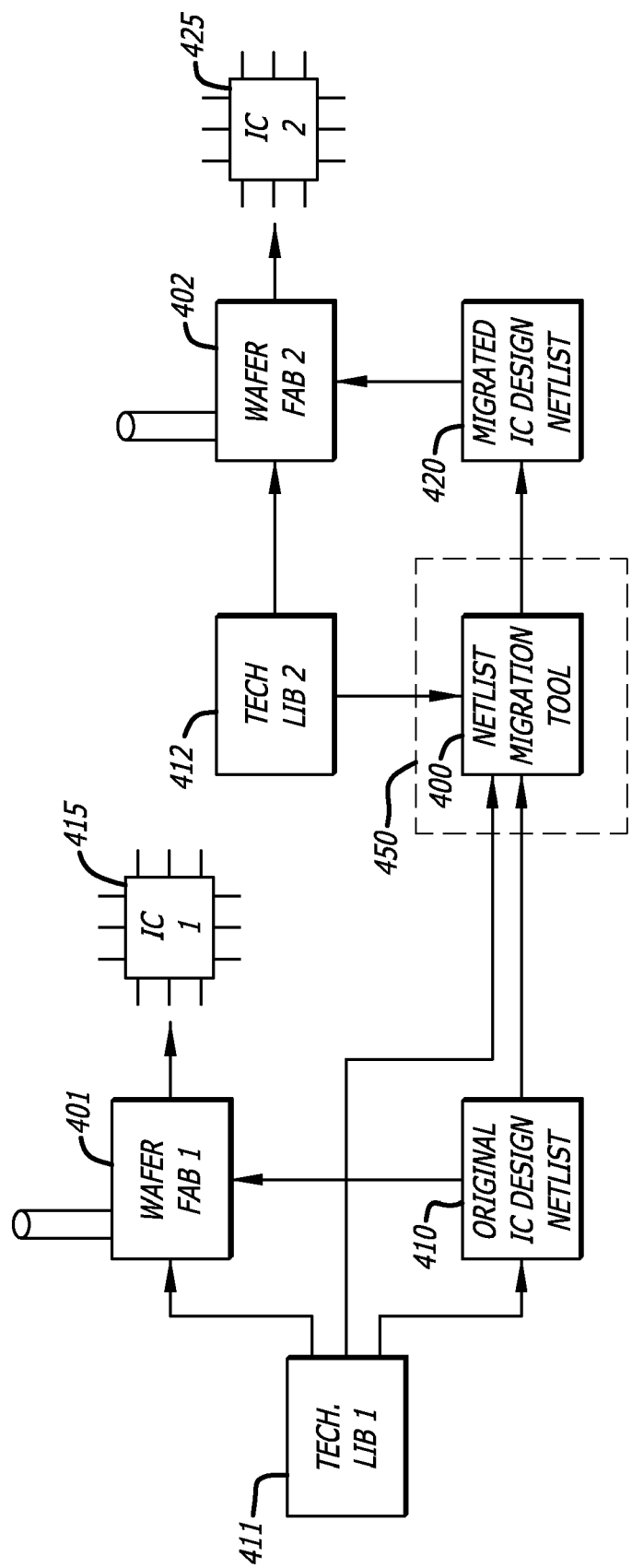
FIG. 4 is a block diagram illustrating the migration of an integrated circuit design from one wafer fabrication facility to another.

Referring now to FIG. 4, a block diagram of netlist migration from a first wafer fabrication facility 401 to a second wafer fabrication facility 402 is illustrated using a netlist migration software tool 400. The netlist migration software tool 400 may be a stand alone electronic computer aided design (ECAD) tool that operates with a synthesis tool or it may be integrated into a synthesis tool 450 and coincidentally executed with it.

The first wafer fabrication facility 401 has a first standard cell library associated with it, including a first technology library 411. A first integrated circuit is designed using the first technology library 411 and is represented by an original or first integrated circuit design netlist 410. Responsive to the first netlist 410 and the first technology library 411, a plurality of first integrated circuits 415 are manufactured across a semiconductor wafer in the first wafer fabrication facility 401.

It is desirable to manufacture the integrated circuit in the second wafer fabrication facility 402 that differs from the first. The second wafer fabrication facility 402 has a second standard cell library associated with it, including a second technology library 412 that differs from the first. Executing the netlist migration software tool 400 in response to the first IC design netlist 410, the first technology library 411, and the second technology library 412, a migrated or second IC design netlist 420 may be automatically generated so that the functionality of the original integrated circuit design may be manufactured in the second wafer fabrication facility 402. That is, while the technology libraries and the wafer fabrication facilities may differ to improve the performance or yield of an integrated circuit, the logical functionality of the first integrated circuit 415 and the second integrated circuit 425 are to be substantially similar if not exactly the same.

Responsive to the second netlist 420 and the second technology library 412, a plurality of second integrated circuits 425 may be manufactured across a semiconductor wafer in the second wafer fabrication facility 402. The second wafer fabrication facility 402 may be used to manufacture the second integrated circuits 425 instead or in additional to the first wafer fabrication facility 401 manufacturing the first integrated circuits 415 for a number of reasons. For example, a second source supplier for the integrated circuit may be required. The second wafer fabrication facility has improved design rules that will lead to less expensive manufacturing of the integrated circuit for example. The first wafer fabrication facility may be using an old process technology and it is slated to be closed down, for example.

Netlist Migration Design Flow

Referring now to FIG. 1, a block diagram illustrates the environment of an ASIC synthesis tool 130 that uses the embodiments of the invention to migrate a netlist from an original set of technology libraries 110 to a new set of technology libraries 120. In some embodiments of the invention, the synthesis tool 130 is an RTL Compiler™ (RC) synthesis tool licensed by Cadence Design Systems, Inc.

The synthesis tool 130 accepts inputs such as the original netlist 105, original design constraints 108 associated with the original netlist 105, the old or original set of technology libraries 110, and the new set of technology libraries 120. The synthesis tool 130 generally unmaps all the cells in the original netlist away from the original set of technology libraries 110 and remaps the cells into the new set of technology libraries 120 to generate a new netlist with new integrated circuit design constraints 140 targeted for a new semiconductor manufacturing process.

A set of technology libraries or a technology library is generally logical and physical descriptions of the standard logic cells and perhaps custom logic cells, functional blocks, and macro cells that are available for instantiation in an integrated circuit design for a particular semiconductor manufacturing process. A macro-cell or macro is a complex application specific integrated circuit (ASIC) cell that performs some standard function, such as a core processor. The macro-cell may be a hard macro or a soft macro. A hard macro may be considered to be a black box as its physical layout is fixed to certain IC design rules for a specific semiconductor manufacturing process for which it was originally designed and characterized. In contrast, a soft macro is defined at a cell library and netlist level and not the physical layout level so that it can be readily migrated to a new set of technology libraries. While a soft macro may implement the same electrical functionality of a hard macro, the cells of a soft macro can be unmapped from an original set of technology libraries and then re-mapped into a new set of technology libraries.

A black-box is a pre-designed block such as a macro cell, IP core, or other functional block with internal details that are hidden from the IC designer. A black-box is often designed for a particular semiconductor manufacturing process and may require a new black box from a silicon vendor to replace an original black box when migrating a netlist to a new set of technology libraries and a new semiconductor manufacturing process. As mentioned previously, a hard macro may be considered to be a black box.

Mapping in a synthesis tool is generally the automated process of instantiating or associating physical cells from the cell library or set of technology libraries into the netlist. The mapping process makes the netlist technology dependent upon a particular semiconductor manufacturing process that may be only available at one semiconductor wafer fabrication facility. Unmapping or de-mapping is the reverse process to mapping. Generally, unmapping is an automated process of disassociating the physical cells from an old cell library or an old set of technology libraries from the netlist. The unmapping process backs the original netlist away from its technology dependency so that it can then be re-mapped into another semiconductor manufacturing process.

Integrated circuit design constraints are generally any set of rules, barriers, or restrictions that limits the variability of an integrated circuit design. The design constraints are saved in a file that is typically in a Synopsis design constraint (SDC) standard file format and thus they are also often referred to as SDC design constraints.

The new netlist and new design constraints 140 are then used to complete and manufacture the new integrated circuit design 150 so that it can be mass produced on wafers in a targeted semiconductor wafer fabrication facility and tested for functionality and performance.

After manufacturing and testing the new integrated circuit design 150, it may then be incorporated into electronic devices 160, such as cell phones televisions, computers, etc.

Netlist Migration Synthesis Software Tool

Figure 2:
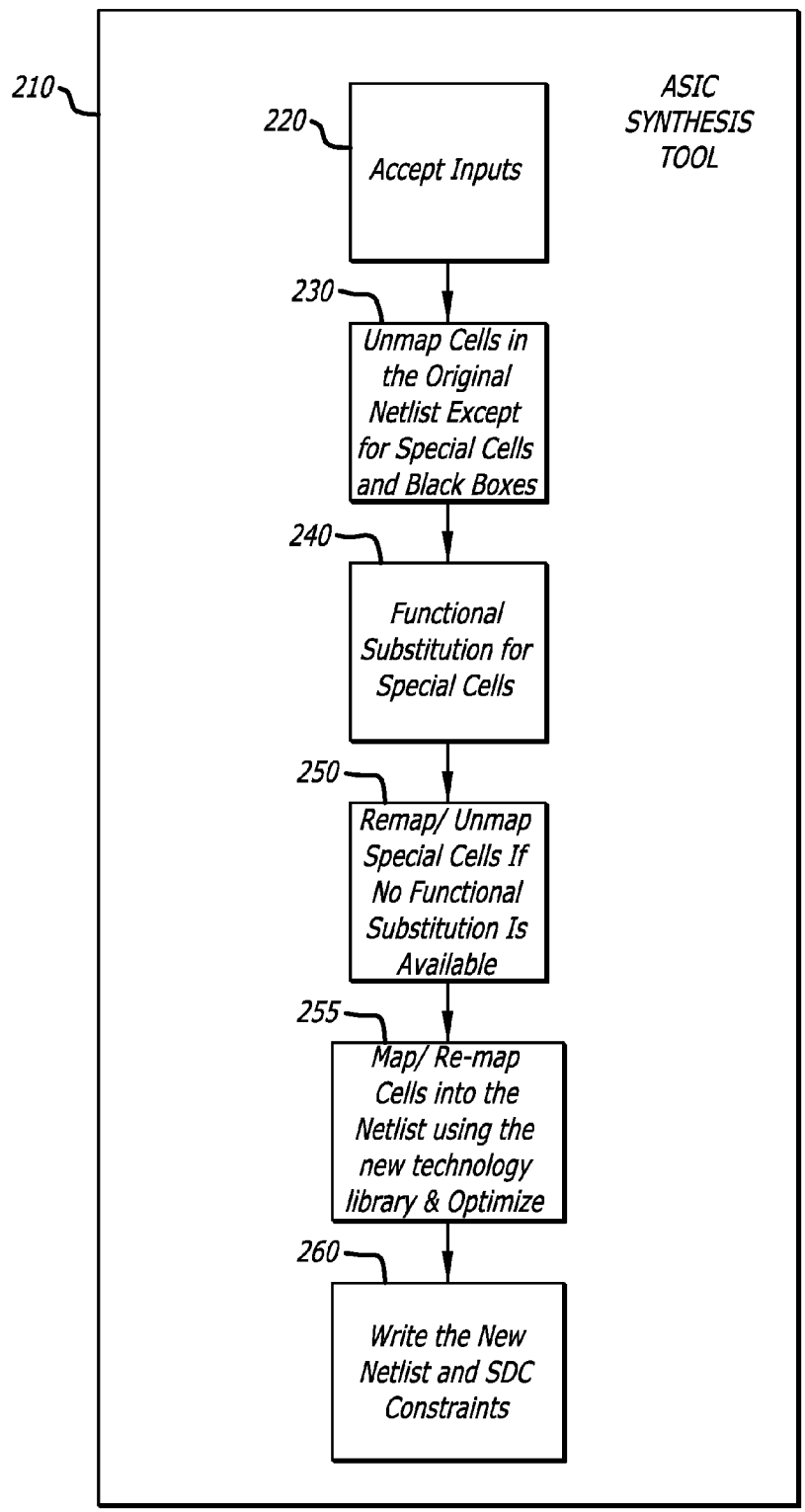
FIG. 2 is a block diagram illustrating the basic process of translation within an ASIC synthesis tool.

Referring now to FIG. 2, a flow chart is illustrated of the general translation process that takes place within an ASIC synthesis tool 210 to migrate a netlist to another technology library and silicon foundry.

The synthesis tool 210 first accepts or receives several inputs 220 including the original netlist, the original integrated circuit design constraints (usually in a Synopsis design constraint (SDC) file format) with respect to the original netlist, and both the original and the new set of technology libraries ("Inputs").

All the cells in the original netlist (the "regular cells"), except for the mapped design-for-test (DFT) flip-flops (e.g., scan flip-flops), gates with exceptions or constraints, clock-gated integrated cells (CGICs) (collectively as "special cells"), and black-boxes are then unmapped 230 from the original technology library. Cells that are black boxes and special cells are carefully treated by the synthesis tool to ensure that there is no loss of information during the translation process. The unmapped regular cell instances in the netlist are then later mapped or re-mapped 255 with cells from the new set of technology libraries and optimized.

Regarding the special cells, a functional-based substitution 240 is first used to find a precise functional match from the new netlist for the special cells in the original netlist. If no match is available from the new netlist, the synthesis tool undergoes a process of remapping and unmapping any unmatched special cells 250.

After the special cells are handled and the regular cells are mapped or remapped, the synthesis tool may write out a new netlist with its design constraints 260.

Detailed Netlist Migration Methodology

Figure 3A:
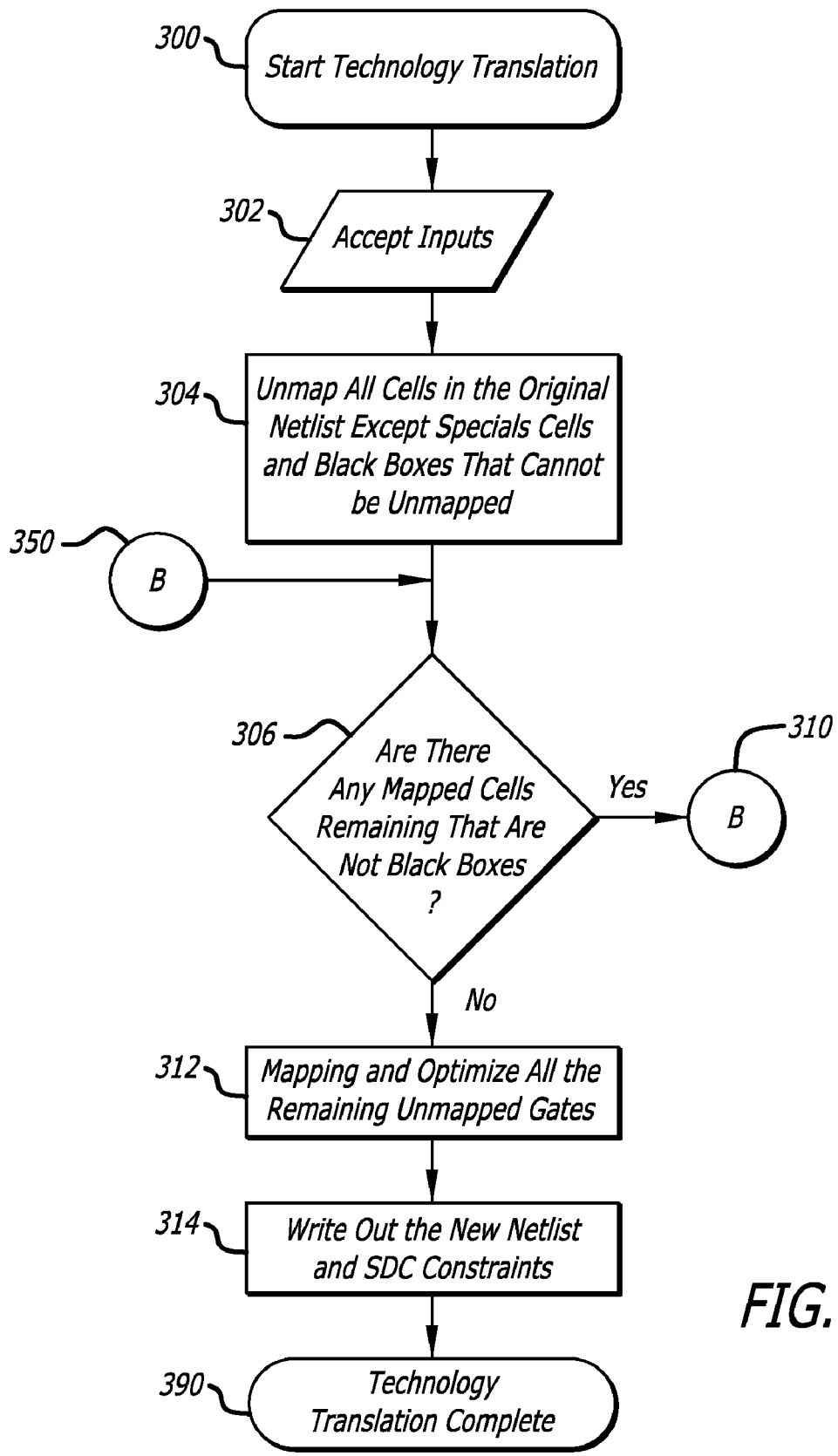
FIGS. 3A and 3B is a flowchart illustrating the netlist migration process in accordance with one embodiment of the invention.
Figure 3B:
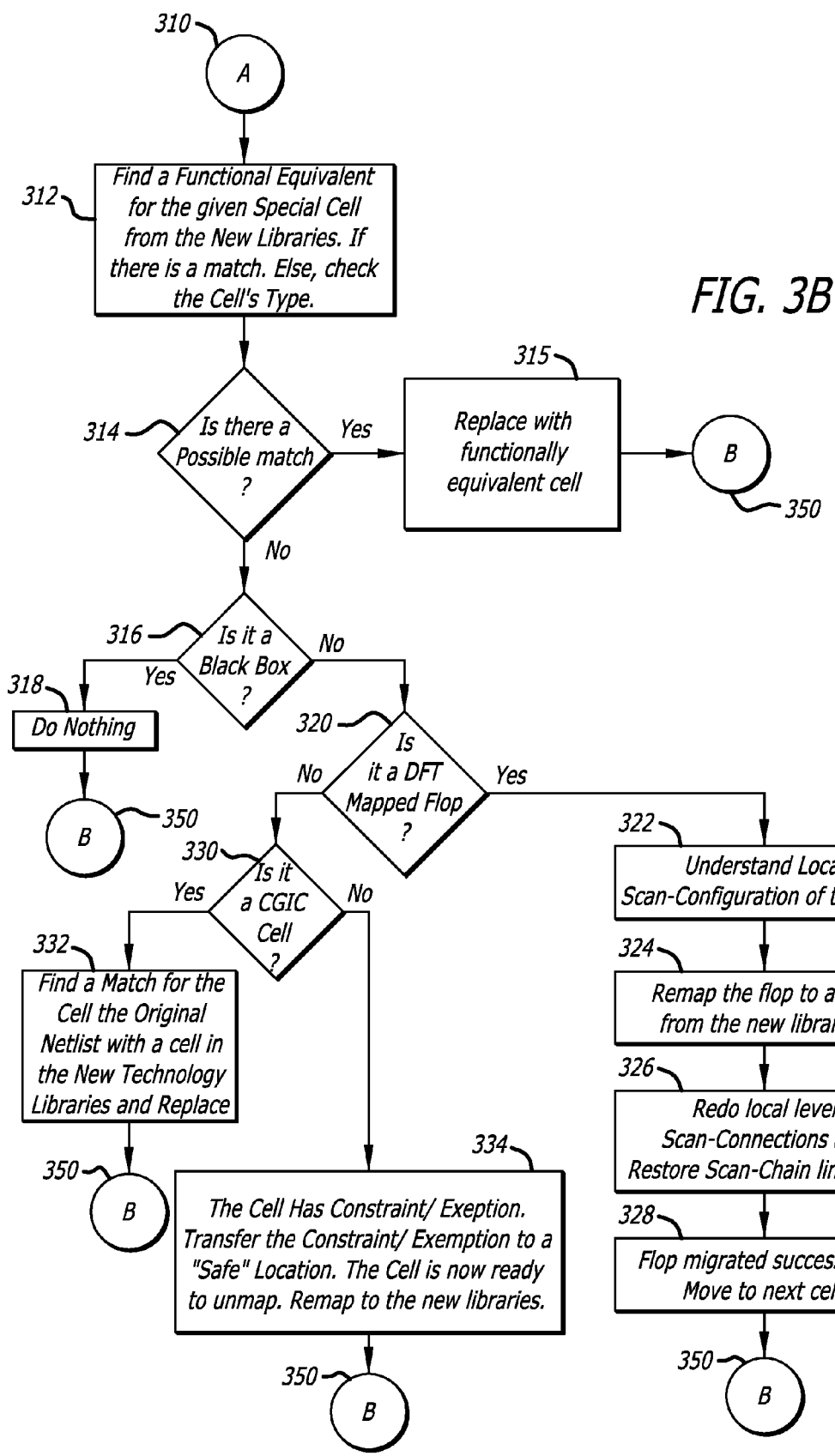

Referring now to FIGS. 3A-3B, a flow chart illustrates the detailed operation of the technology translation flow covering the possible types of scenarios that may occur in a given netlist. The embodiments of the invention may be used with a number of synthesis tools, including the RTL Compiler™ (RC) synthesis tool licensed by Cadence Design Systems, Inc.

The technology translation process starts at process block 300. At process block 302, input information is received by the synthesis software tool including the original netlist, the original integrated circuit design constraints (usually in a Synopsis design constraint (SDC) file format) with respect to the original netlist, and both the original and the new set of technology libraries ("Inputs").

In response to the input information, the synthesis tool may classify the gates in the netlist into the following categories: design-for-test (DFT) mapped flip-flops, gates with exceptions or constraints (unmapping these gates without special treatment may cause the constraints to drop or become invalid), clock-gated integrated cells (CGICs), and black-boxes.

The synthesis tool then begins to unmap all the cells in the original netlist, except for the black boxes and special cells 304. These regular cells do not require special attention and may be mapped onto the new library by the synthesis tool at a later stage in the process (see process block 312).

At process 306 after the regular cells have been unmapped, a determination may be made if there are any special cells remaining that are still mapped into the original netlist with the original technology library. If so, the process jumps to process connector 310 on FIG. 3B.

Then synthesis tool attempts to translate the special cells from the original netlist to the new netlist. The special cells require special attention because unmapping any of these cells without taking into considerations various factors, such as constraints and scan connections, may result in a loss of information which could not be easily recoverable. A two pronged approach is used to handle the special cells: (1) function based substitution 312 and (2) remapping of individual cells (e.g., 324, 332, 334).

In a functional substitution process 312, the synthesis tool searches for a substantial if not exact functional match for each cell in the original netlist with a cell in the new set of technology libraries. If it is determined at process 314 that there was a match, the synthesis tool then makes a direct substitution by replacing the special cell associated with the original set of technology libraries with the functionally equivalent cell of the new set of technology libraries. After a direct substitution, no further unmapping is required for the special cell and the process returns 350.

On the other hand, if no functional equivalence is found, the cells must be remapped individually. Not all cells in the original technology libraries will have a one to one correspondence in functionality with the cells in the new set of libraries. Such cells require careful remapping to ensure no loss of information during translation.

With no functional equivalence, a determination is made if a cell is a black box at process 316. If so, when the synthesis tool comes across any black boxes in the design, it will do nothing and ignore the black box 318 for the moment and continue to the process the next cell through the return process 350. The assumption here is that if these cells are macros, then they would be part of the new set of technology libraries and can be simply replaced in the netlist with the new black box cells that are available from the new set of technology libraries. Hence a simple substitution of an original black box cell for a new black box associated with the new technology library migrates the black box to the new netlist and the new set of technology libraries.

If at process 316 it is determined that the special cell is not a black box, the process tires to determine what type of special cell it may be.

At process 320, a determination is made if the special cell is a DFT mapped flip-flop. If the cell is a DFT mapped flip-flop, the synthesis tool analyzes the cell and the original netlist and saves information regarding its connections to prevent a loss of data during netlist migration to the new set of technology libraries. The most essential information for these cells is the scan connections between the flip-flops and the rest of the circuitry. Blindly unmapping any of these cells without attention to the connections may result in having broken scan chains. Therefore, the synthesis tool first studies the original netlist to locally understand the scan-configurations of the flip-flop during an analysis process 322 of the netlist and cell. Then the DFT flip-flop is unmapped to a generic flip-flop, and the generic flip-flop is re-mapped to a scan-flip-flop from the new set of libraries during process 324. Then, during process 326 the saved information is used to redo the local level scan connections and restore scan chain linkages to maintain the local level scan-connections of the original netlist. Maintaining local level scan-chains also ensures global scan-chains are also maintained. With the DFT flip flop successfully migrated from the original netlist to the new netlist and associated with the net set of technology libraries 328, the next special cell can be processed. The process returns 350 to analyze the next special cell, if any.

In an alternate embodiment of the invention for handling scan chains, the scan-configuration is analyzed before doing any sort of translation. Then all the scan-flip-flops are unmapped thereby breaking all the scan-chains. The entire scan-synthesis process is then performed again based on the original scan-configuration. However, this methodology of handling scan chains is less automated and requires a greater amount of effort on part of an IC designer.

If at process 320 it was determined that the special cell was not a DFT mapped flip-flop, the process goes to process block 330 to make a determination if the special cell is a clock-gated integrated cell (CGIC). If the process 330 determines that the special cell is not a clock-gated integrated cell (CGIC), the process goes to process block 334 to treat the special cell as being a cell with a design constraint or exception.

If a cell is a gate with constraints or exceptions, the constraints or exceptions will be transferred to a "safe" location, such as a buffer, from the new libraries in the new netlist. The synthesis tool generates the constraint and ensures that no constraint is dropped during the remapping process of the special cell into the new netlist. With the constraint stored in a safe location, the cell associated with the original set of technology libraries can be unmapped and the cell can be remapped and associated with the cell in the new set of technology libraries. The process then returns 350 to analyze the next special cell, if any.

If the process 330 determines that the special cell is a clock-gated integrated cell (CGIC), the process jumps to block 332. During process 332, the synthesis tool attempts to find a cell in the new netlist that has the same attributes in the technology library as the CGIC in the old netlist. Because CGICs do not have functional information in the technology libraries, the attributes of the CGICs are the only information that the synthesis tool has available to perform a match during migration. Based on the attributes of the CGICs, the synthesis tool searches in the new technology libraries for an equivalent that can completely describe the "type" of each of these CGICs, and then a cell replacement is made. If an equivalent cell of the desired "type" is not available in the new technology library then the cell in the original netlist is replaced by a combination of cells from the new technology library which substantially and correctly matches the "type" of the cell in the original netlist. The process then returns 350 to analyze the next special cell, if any.

The synthesis tool continues this process of unmapping and remapping until all the special cells from the original netlist are completely mapped. With all the special cells being migrated and mapped into the new netlist somehow, the process block 306 eventually determines that there are no further special cells in the original netlist that require migration and the process goes to process block 312.

During process 312, the regular cells that remain unmapped are now mapped into the new netlist and associated with the set of new technology libraries and they are also optimized.

Once cell mapping and optimization are complete, the synthesis tool writes out or generates the new netlist and the new design constraints (e.g., SDC constraints) for the new set of technology libraries during process 314.

With the new netlist and its design constraints being finally generated for the new set of technology libraries, the translation process is completed and the process ends at process block 390.

Computer System for Use with Netlist Migration Software

Figure 5:
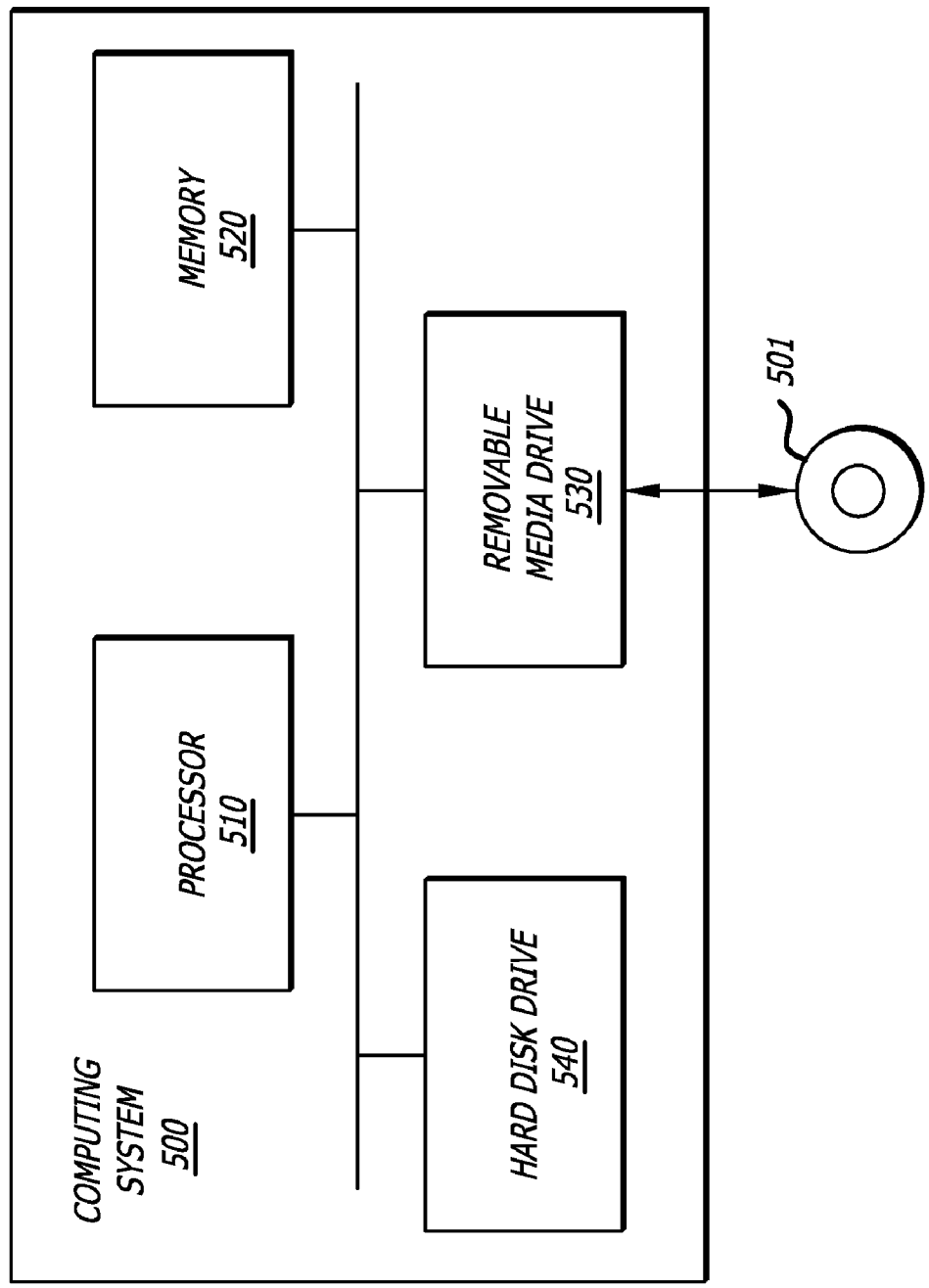
FIG. 5 is a block diagram illustrating an exemplary computer system that may be used to perform some or all of the processes in accordance with a number of embodiments of the invention.

Referring now to FIG. 5, a computing system 500 is illustrated that may be used to perform some or all of the processes in accordance with a number of embodiments of the invention. In one embodiment of the invention, the computing system 500 includes a processor 510, a memory 520, a removable media drive 530, and a hard disk drive 540. In one embodiment, the processor 510 executes instructions residing on a machine-readable medium, such as the hard disk drive 540, a removable medium 501 (e.g., an optical medium (compact disk (CD), digital video disk (DVD), etc.), a magnetic medium (magnetic disk, a magnetic tape, etc.), or a combination of both. The instructions may be loaded from the machine-readable medium into the memory 520, which may include Random Access Memory (RAM), dynamic RAM (DRAM), etc. The processor 510 may retrieve the instructions from the memory 520 and execute the instructions to perform the operations described above.

Note that any or all of the components and the associated hardware illustrated in FIG. 5 may be used in various embodiments of the system 500. However, it should be appreciated that other configurations of the system 500 may include more or less devices than those shown in FIG. 5.

Some portions of the preceding detailed description have been presented in terms of algorithms and symbolic representations of operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The embodiments of the invention also relates to an apparatus for performing the operations described herein. This apparatus may be specially constructed for the required purposes, or it may comprise a general-purpose computer selectively activated or reconfigured by a computer program stored in the computer. Such a computer program may be stored in a machine or computer readable storage medium, such as, but is not limited to, any type of disk including floppy disks, optical disks, CD-ROMs, and magnetic-optical disks, read-only memories (ROMs), random access memories (RAMs), magnetic storage media, magnetic disk storage, magnetic cards; optical storage media, optical disk storage, optical cards; flash memory devices, EPROMs, EEPROMs; electrical, optical, acoustical or other form of propagated signals (e.g., carrier waves, infrared signals, digital signals, etc.) or any type of media suitable for storing electronic instructions, and each coupled to or coupled into a computer system bus.

Note however, the processes and displays presented herein are not inherently related to any particular computer or other apparatus. Various general-purpose systems may be used with programs in accordance with the teachings herein, or it may prove convenient to construct a more specialized apparatus to perform the operations described. In addition, the embodiments of the invention are not described with reference to any particular programming language. It will be appreciated that a variety of programming languages may be used to implement the teachings of the invention as described herein.

CONCLUSION

While the invention has been disclosed by reference to the various embodiments and examples detailed above, it should be understood that these examples are intended in an illustrative rather than limiting sense, as it is contemplated that modifications will readily occur to those skilled in the art which are intended to fall within the scope of the embodiments of the invention. For example, the embodiments of the invention have been described for migrating a netlist to a new set of technology libraries associated with a new wafer fabrication manufacturing facility. However, the embodiments of the invention may be applied to automatically replace a set of cells in a given netlist with another set of cells of another cell library for whatever reason. Instead, the embodiments of the invention should be construed by the claims that follow below.

What is claimed is:

1. A method of migrating an original netlist for an integrated circuit design from one set of technology libraries to another, the method comprising:
   receiving an original netlist, an original set of technology libraries, original design constraints, and a new set of technology libraries to which the original netlist is to migrate;
   with a processor, unmapping cells in the original netlist away from the original set of technology libraries, but for special cells and black boxes, and remapping the unmapped cells of the original netlist using the new set of technology libraries;
   with a processor, translating the special cells in the original netlist to the new set of technology libraries; and
   with a processor, generating a new netlist and new design constraints in response to the new set of technology libraries, the original netlist, and the original design constraints.

2. The method of claim 1 wherein
   the special cells are design-for-test (DFT) mapped flip-flops, logic gates with exceptions or constraints, and clock-gated integrated cells (CGICs).

3. The method of claim 1 wherein
   the translating of the special cells in the original netlist to the new set of technology libraries includes searching for a substantial functional match for the special cells in the original netlist with cells in the new set of technology libraries;
substituting special cells in the original netlist with new cells from the new set of technology libraries in response to finding a functional match; and
if a functional match is not found for a special cell, remapping the special cell in the original netlist to a new cell in the new set of technology libraries.

4. The method of claim 1 further comprising:
ignoring black boxes in the unmapping and translating as they are considered to be macros and part of the new set of technology libraries.

5. The method of claim 4 further comprising:
replacing the black boxes of the original netlist with new black boxes associated with the new set of technology libraries.

6. The method of claim 1 wherein
the unmapping of cells in the original netlist includes classifying logic gates in the original netlist into different categories in response to the original netlist, an original set of technology libraries, original design constraints, and the new set of technology libraries.

7. The method of claim 6 wherein
the categories of the logic gates include design-for-test (DFT) mapped flip-flops, logic gates with exceptions or constraints, clock-gated integrated cells (CGICs), and black-boxes.

8. The method of claim 7 wherein
if a special cell is categorized as a DFT mapped flip-flop, the method includes
locally understanding the scan-configurations of the flip-flop including local level scan connections,
unmapping said DFT mapped flip-flop into a generic flip-flop, and
remapping said DFT mapped flip-flop to a scan-flip-flop from the new set of libraries while maintaining intact the local level scan connections.

9. The method of claim 7 wherein
if a special cell is categorized as a logic gate with constraints or exceptions, the method includes
transferring the constraints or exceptions to a safe location before remapping the logic gate to the new set of technology libraries.

10. The method of claim 9 wherein
said safe location can be a buffer in the new set of technology libraries.

11. The method of claim 7 wherein
if a special cell is categorized as a clock-gated integrated cell (CGIC), the method includes
searching for a cell in the new netlist that has the same attributes as the CGIC in the original netlist.

12. The method of claim 11 wherein
if the synthesis tool finds a cell in the new netlist that has the same attributes as said CGIC in the original netlist, the synthesis tool replaces said CGIC with another instance of the cell in the new netlist or else a combination of cells from the new technology library in the new netlist.

13. A method for migrating an integrated circuit design from a first semiconductor manufacturing technology to a second semiconductor manufacturing technology, the method comprising:
with a computing system
receiving an original gate-level netlist representing the integrated circuit design;
receiving a first technology library and original design constraints associated with the original gate-level netlist;
receiving a second technology library to migrate the original netlist;
comparing the first technology library against the second technology library; and
but for special cells and black boxes, automatically remapping cells of the first technology library in the original netlist to cells of the second technology library to generate a new netlist representing the integrated circuit design with new design constraints for manufacture in the second semiconductor manufacturing technology.

14. The method of claim 13, further comprising:
translating special cells in the original netlist to the new set of technology libraries.

15. The method of claim 14 wherein
the special cells are design-for-test (DFT) mapped flip-flops, logic gates with exceptions or constraints, and clock-gated integrated cells (CGICs).

16. The method of claim 14 wherein
the translating of the special cells in the original netlist to the new set of technology libraries includes
searching for a substantial functional match for the special cells in the original netlist with cells in the new set of technology libraries;
substituting special cells in the original netlist with new cells from the new set of technology libraries in response to finding a functional match; and
if a functional match is not found for a special cell, remapping the special cell in the original netlist to a new cell in the new set of technology libraries.

17. The method of claim 13 further comprising:
replacing the black boxes of the original netlist with new black boxes associated with the new set of technology libraries into the new netlist.

18. The method of claim 13, wherein
the new netlist and new design constraints are generated in response to the second technology library, the first technology library, the original netlist, and the original design constraints.

19. The method of claim 13, wherein
the automatically remapping of cells of the first technology library in the original netlist to cells of the second technology library includes
unmapping cells in the original netlist associated with the first technology library, but for special cells and black boxes; and
mapping cells of the second technology library into the new netlist.

20. A machine-readable product for migrating a netlist of an integrated circuit from one technology library to another, the machine-readable product comprising:
a machine readable medium having stored therein
machine readable program code executable by a processor to receive an original netlist, an original set of technology libraries, original design constraints, and a new set of technology libraries to which the original netlist is to migrate;
machine readable program code executable by a processor to unmap cells in the original netlist away from the original set of technology libraries, but for special cells and black boxes, if any, and remap the unmapped cells of the original netlist using the new set of technology libraries;

machine readable program code executable by a processor to translate the special cells in the original netlist to the new set of technology libraries, if any;

machine readable program code executable by a processor to replace the black boxes of the original netlist with new black boxes associated with the new set of technology libraries into the new netlist, if any; and machine readable program code executable by a processor to generate a new netlist and new design constraints in response to the new set of technology libraries, the original netlist, and the original design constraints.

21. The machine-readable product of claim 20, wherein the machine readable medium is a semiconductor storage medium, a magnetic storage medium, or an optical storage medium.

* * * * *